United States Patent [19]

Toda et al.

[11] Patent Number: 4,835,007
[45] Date of Patent: May 30, 1989

[54] METHOD OF MANUFACTURING A PHOTOELECTRIC CONVERSION DEVICE

[75] Inventors: Kohji Toda, Yokosuka; Kohji Takahashi; Yasuo Niwa, both of Tokyo, all of Japan

[73] Assignee: TDK Corporation, Tokyo, Japan

[21] Appl. No.: 108,330

[22] Filed: Oct. 14, 1987

Related U.S. Application Data

[62] Division of Ser. No. 873,881, Jun. 13, 1986, Pat. No. 4,724,157.

[30] Foreign Application Priority Data

| Dec. 14, 1985 | [JP] | Japan | 60-281678 |
| Dec. 14, 1985 | [JP] | Japan | 60-281677 |
| Dec. 14, 1985 | [JP] | Japan | 60-281676 |
| Dec. 14, 1985 | [JP] | Japan | 60-281671 |
| Dec. 14, 1985 | [JP] | Japan | 60-281672 |
| Dec. 14, 1985 | [JP] | Japan | 60-281673 |
| Dec. 14, 1985 | [JP] | Japan | 60-281674 |
| Dec. 14, 1985 | [JP] | Japan | 60-281675 |
| Jan. 31, 1986 | [JP] | Japan | 61-020780 |
| Jan. 31, 1986 | [JP] | Japan | 60-020779 |
| Jan. 31, 1986 | [JP] | Japan | 60-020778 |
| Jan. 31, 1986 | [JP] | Japan | 61-020771 |
| Jan. 31, 1986 | [JP] | Japan | 61-020772 |
| Jan. 31, 1986 | [JP] | Japan | 61-020773 |
| Jan. 31, 1986 | [JP] | Japan | 60-020774 |
| Jan. 31, 1986 | [JP] | Japan | 61-020775 |
| Jan. 31, 1986 | [JP] | Japan | 61-020776 |
| Jan. 31, 1986 | [JP] | Japan | 60-020777 |

[51] Int. Cl.[4] ............................................. B05D 3/06
[52] U.S. Cl. ............................ 427/42; 204/192.1; 427/74; 427/294; 427/377
[58] Field of Search ............... 427/42, 74, 294, 377; 204/192.1

[56] References Cited

U.S. PATENT DOCUMENTS 4,724,157 2/1988 Toda ........................................ 427/42

Primary Examiner—Bernard Pianalto
Attorney, Agent, or Firm—Armstrong, Nikaido, Marmelstein, Kubovcik & Murray

[57] ABSTRACT

A method of manufacturing a photoelectric conversion device, comprising: forming a thin film of a substance containing PbO and $Cr_2O_3$ in a vacuum by an electron beam evaporation process using the substance as a target; and subjecting the thin film to heat treatment in an atmosphere containing at least Pb.

13 Claims, 3 Drawing Sheets

METHOD OF MANUFACTURING A PHOTOELECTRIC CONVERSION DEVICE

This is a division, of application Ser. No. 873,881 filed June 13, 1986, now U.S. Pat. No. 4,724,157.

BACKGROUND OF THE INVENTION

1. Field of the Invention

The present invention relates to a photoelectric conversion device using an oxide containing lead and chromium (hereinafter referred to as "Pb—Cr oxide"), and a method of manufacturing the same.

2. Description of the Prior Art

As is generally known, a photoelectric conversion device employing a pn or pnp junction semiconductor element or a semiconductor-metal junction element has been widely used. Such a photoelectric conversion device is capable of generating an electromotive force and hence does not need any external electromotive force.

During the study of oxide dielectrics, the applicant of the present invention discovered the photoelectric conversion phenomena of dielectrics and made an application for patent on a photoelectric conversion device employing a conductive layer of a Pb—Cr oxide (Japanese patent application No. 53-20583, Japanese Patent Publication No. 55-35874). In this prior photoelectric conversion device, the incident light is converted into an electric current by an oxide, and the electric current flows through a conductive layer outside the photoelectric conversion device. When the oxide is formed in a thin film, the oxide exhibits a photosensitive property and generates an electromotive force corresponding to the intensity of the incident light, and when the oxide is formed in a thick film, the oxide exhibits an electricity storage effect.

A method of manufacturing the photoelectric conversion device disclosed in the foregoing patent application comprises forming a sintered body by sintering a mixture of lead oxide and chromium oxide, and forming a conductive layer on the sintered body.

This method employing a sintering process, however, has problems that the reduction of the thin film of a dielectric body is limited to a certain extent and that it is difficult to form a uniform thin film not having excessive pores. Furthermore, the thin dielectric film manufactured by the above method is unable to transmit light and hence unable to serve as an element of various photoelectric conversion devices of high conversion efficiency.

SUMMARY OF THE INVENTION

Accordingly, it is an object of the present invention to provide a photoelectric conversion device provided with a light-transmissive thin film.

It is another object of the present invention to provide a method of manufacturing a photoelectric conversion device provided with a uniform thin film having only a small number of pores.

In order to achieve the objects of the invention, a Pb—Cr oxide having a conductive layer is used.

According to the present invention, a thin film of a Pb—Cr oxide is formed under vacuum by using the Pb—Cr oxide as a target, and then the thin film of the Pb—Cr oxide is subjected to heat treatment in an atmosphere containing at least Pb.

The above and other objects, features and advantages of the present invention will become more apparent from the following description of preferred embodiments thereof taken in conjunction with the accompanying drawings.

DESCRIPTION OF THE PREFERRED EMBODIMENTS

[I]Construction

Figure 1:
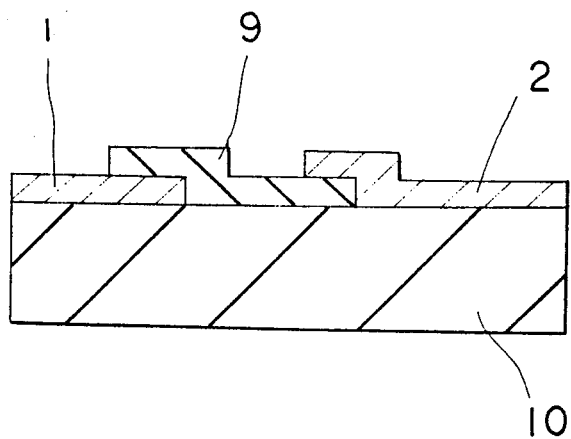
FIG. 1 is a sectional view of a photoelectric conversion device, in a preferred embodiment, according to the present invention.

Referring to FIG. 1 showing a photoelectric conversion device embodying the present invention, a thin Pb—Cr oxide film 9, for example, a thin $Pb_2CrO_5$ film 9, is formed over the surface of a glass substrate 10. A pair of spaced apart conductive films such as gold films 1 and 2 are formed on the surface of the thin $Pb_2CrO_5$ film 9. The thin $Pb_2CrO_5$ film 9 is heat treated after being formed by an electron beam evaporation process, which will be described later. The pair of the gold films 1 and 2 is formed by a vacuum evaporation process or the like. Thus, the photoelectric conversion device comprises a pair of the gold films 1 and 2, the glass substrate 10 and the $Pb_2CrO_5$ film 9.

Figure 2:
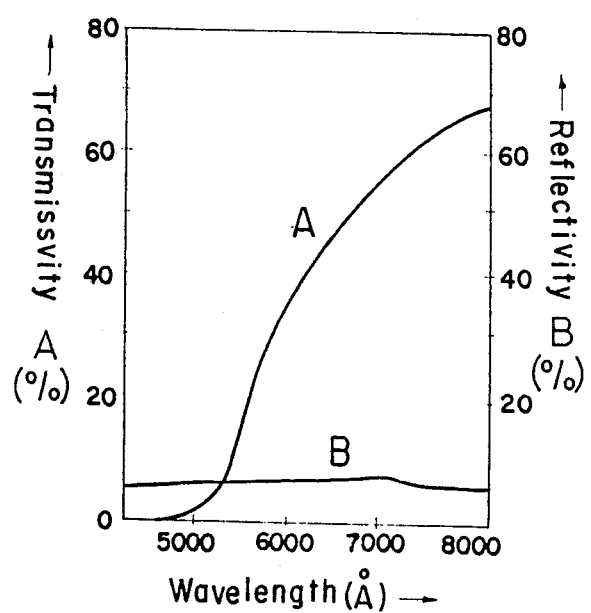
FIG. 2 is a graph showing the variation of the transmissivity and reflectivity of a photoelectric conversion device embodying the present invention with the wavelength of light.

The thin $Pb_2CrO_5$ film 9 thus formed is tinted with orange and has a light transmission characteristic A and a light reflective characteristic B shown in FIG. 2. In the graph of FIG. 2, the abscissa is the wavelength (Å) of the reflected light and the ordinate is transmissivity (%) and reflectivity (%). This transmissivity A is the unique characteristic of the photoelectric conversion device of the present invention, and no conventional sintered body has such a light transmission characteristic.

Figure 4:
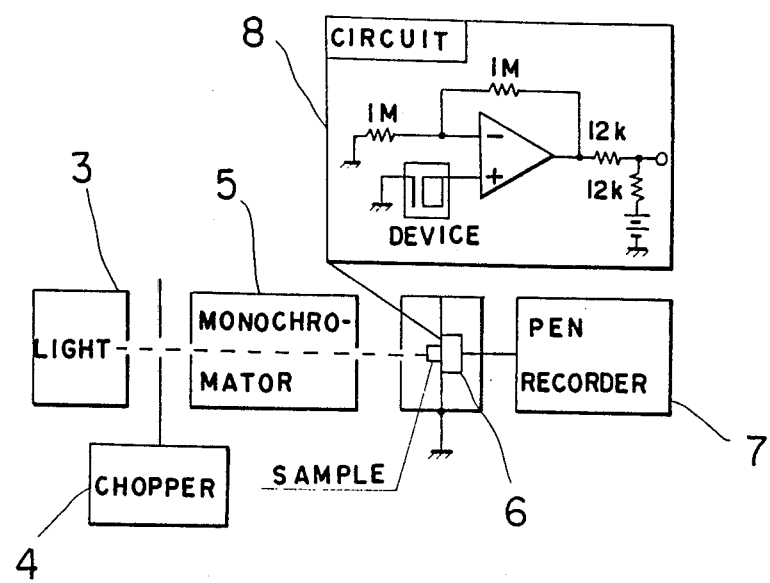
FIG. 4 is a block diagram of a measuring apparatus for measuring the characteristics of photoelectric conversion devices manufactured by a method according to the present invention.
Figure 5:
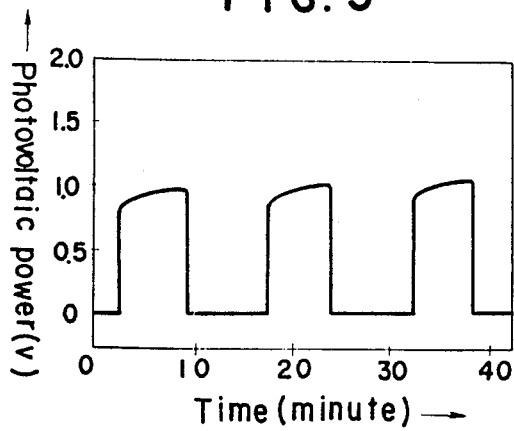
FIGS. 5 and 6 are graphs showing the variation of the photovoltage with time, and the variation of the photovoltage with the intensity of light, respectively, of a photoelectric conversion device embodying the present invention.
Figure 6:
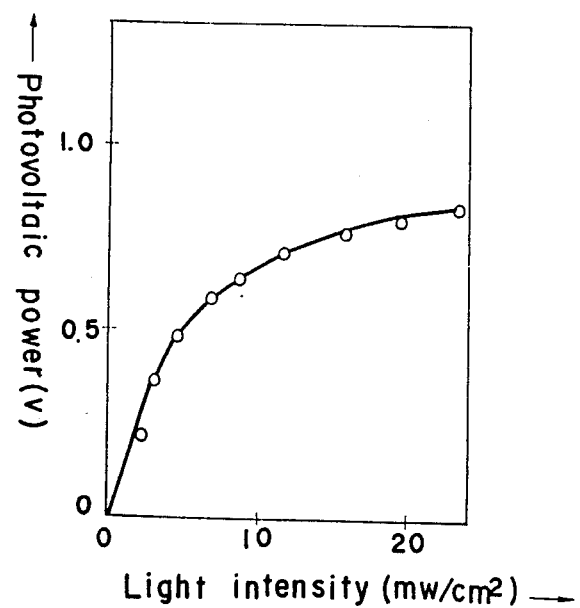

FIGS. 5 and 6 show the results of measurement of the photovoltage of the photoelectric conversion device by a measuring apparatus shown in FIG. 4. In FIG. 4, there are shown a light source 3, a chopper 4, a monochromator 5, a test sample 6, a pen recorder 7 and a measuring circuit 8. In FIG. 5, the abscissa is time (min) and the ordinate is photovoltage (V), while in FIG. 6, the abscissa is the intensity of light (mW/cm$^2$) and the ordinate is photovoltage (V).

FIG. 5 shows the variation of the photovoltage of the photoelectric conversion device when the photoelectric conversion device is illuminated intermittently. When the light source is turned on, the photovoltaic power increases from zero upward and when the light source is turned off, the photovoltage decreases to zero. Thus, the photoelectric conversion device produces photovoltage when exposed to light.

FIG. 6 shows the variation of the photovoltage produced by the photoelectric conversion device with the intensity of light that falls on the photoelectric conversion device. The photovoltage increases in proportion to the intensity of light.

When the photoelectric conversion device of the present invention having the characteristics shown in FIGS. 2, 5 and 6 is used as a photovoltaic element or an optical sensor, the photoelectric conversion device will function at high conversion efficiency owing to its light transmissivity, which is true with a light receiving unit of either the reflection type or the transmission type. Such functions and effects are possible through the use of the transmissive thin $Pb_2CrO_5$ film. The thin $Pb_2CrO_5$ film is a uniform film having few pores.

[II] Manufacturing Method

[A] First embodiment (1) Sample 1

A mixture of PbO and $Cr_2O_3$ of a composition corresponding to the composition of $Pb_2CrO_5$ was wet-blended in a polyethylene pot for ten to fifteen hours. The wet mixture was dried at 400° to 500° C. for two hours, and then the dried mixture was calcined. Then, the calcined mixture was pulverized in a ball mill for ten to fifteen hours into powder of approximately 1 $\mu$ in particle size. A binder was mixed into the powdered preparation, and then the mixture of the powdered preparation and the binder was subjected to pressure molding. The molding thus formed was sintered at 650° to 900° C. for two hours to form a sintered $Pb_2CrO_5$ body.

A thin $Pb_2CrO_5$ film was formed on a glass substrate by an electron beam evaporation process by using the sintered $Pb_2CrO_5$ body as a target (seed) in the following manner.

The sintered $Pb_2CrO_5$ body formed in the shape of a disk of 15.6 mm in diameter and 3.0 mm in thickness and a glass substrate were placed in the vacuum vessel of an electron beam evaporation apparatus. The glass substrate was heated at 350° C. and an accelerating voltage of 4 kV was applied to the electron gun. Evaporation was started when the vacuum vessel was evacuated to a degree of vacuum of $4 \times 10^{-7}$ torr. During the electron beam evaporation process, the degree of vacuum was maintained at $4 \times 10^{-5}$ torr. After the duration of the electron beam evaporation process for about one to two hours, a thin $Pb_2CrO_5$ film of 0.5 to 1.5 $\mu$m in thickness was formed over the surface of the glass substrate.

The glass substrate coated with the $Pb_2CrO_5$ film was heat-treated at 450° C. for 1.5 hours in a crucible containing sintered $Pb_2CrO_5$ powder provided for inhibiting the separation of Pb from the $Pb_2CrO_5$ film to crystallize the amorphous $Pb_2CrO_5$ film formed by the electron bean evaporation process.

Figure 3:
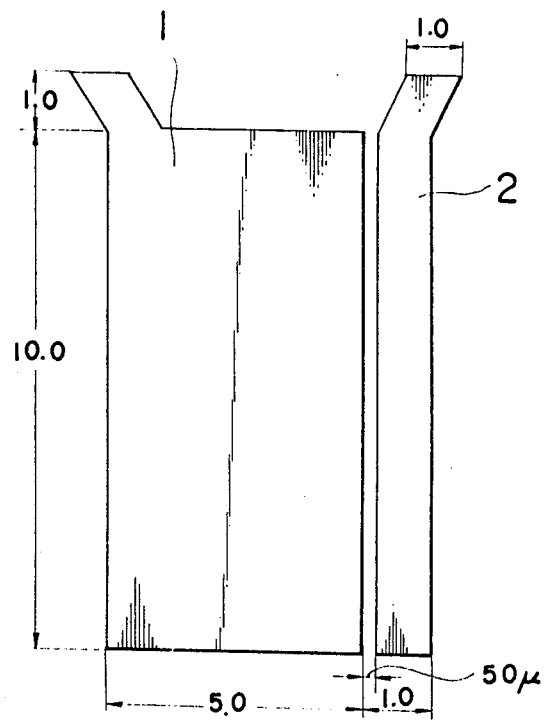
FIG. 3 is an illustration showing the pattern of the electrodes of a photoelectric conversion device embodying the present invention.

Then, a pair of gold films 1 and 2 having a pattern and size as shown in FIG. 3 were formed as electrodes over the $Pb_2CrO_5$ film by a vacuum evaporation process. Thus, a photoelectric conversion device comprising the glass substrate, the $Pb_2CrO_5$ film and the gold films as shown in FIG. 1 was fabricated.

The characteristics of the photoelectric conversion device thus fabricated were measured by a measuring apparatus shown in FIG. 4. The measured results are shown in FIGS. 2, 5 and 6.

(2) Sample 2

A mixture of PbO, $Cr_2O_3$ and $TiO_2$ of a composition corresponding to the composition of $Pb_2CrO_5$ containing 10 mol% $PbTiO_2$ (a perovskite oxide) was subjected to the same processes under the same conditions as those for Sample 1 to obtain a sintered $Pb_2CrO_5$ body containing 10 mol % $PbTiO_2$. A photoelectric conversion device as shown in FIG. 1 was obtained by the same processes and under the same conditions as those for Sample 1 by using the sintered $Pb_2CrO_5$ body containing 10 mol % $PbTiO_2$ (a perovskite oxide) as a target. The characteristics of the photoelectric conversion device thus obtained were measured by the measuring apparatus shown in FIG. 4. The measured results are similar to those for sample 1 as shown in FIGS. 2, 5 and 6.

(3) Sample 3

A mixture of PbO and $Cr_2O_3$ of a composition corresponding to the composition of $Pb_2CrO_5$ containing 30 mol % $K_2CO_3$ (a carbonate of a univalent metal) was subjected to the same processes under the same conditions as those for Sample 1 to obtain a sintered $Pb_2CrO_5$ body containing 30 mol % $K_2CO_3$. A photoelectric conversion device as shown in FIG. 1 was obtained by the same processes and under the same conditions as those for Sample 1 by using the sintered $Pb_2CrO_5$ body containing 30 mol % $K_2CO_3$ as a target. The characteristics of the photoelectric conversion device thus obtained were measured by the measuring apparatus shown in FIG. 4. Measured results are similar to those for sample 1 as shown in FIGS. 2, 5 and 6.

(4) Sample 4

A mixture of PbO and $Cr_2O_3$ of a composition corresponding to the composition of $Pb_2CrO_5$ containing 20 mol % $BaCO_3$ (a carbonate of a bivalent metal) was subjected to the same processes under the same conditions as those for Sample 1 to obtain a sintered $Pb_2CrO_5$ containing 20 mol % $BaCO_3$. A photoelectric conversion device as shown in FIG. 1 was obtained by the same processes and under the same conditions as those for Sample 1 by using the sintered $Pb_2CrO_5$ body containing 20 mol % $BaCO_3$ as a target. The characteristics of the photoelectric conversion device thus obtained were measured by the measuring apparatus shown in FIG. 4. Measured results are shown in FIGS. 2, 5 and 6.

(5) Sample 5

A mixture of PbO and $Cr_2O_3$ of a composition corresponding to the composition of $Pb_2CrO_5$ containing 20 mol % $Al_2O_3$ (an oxide of a trivalent metal) was subjected to the same processes under the same conditions as those for Sample 1 to obtain a sintered $Pb_2CrO_5$ body containing 20 mol % $Al_2O_3$. A photoelectric conversion device as shown in FIG. 1 was obtained by the same processes and under the same conditions as those for Sample 1 by using the sintered $Pb_2CrO_5$ body containing 20 mol % $Al_2O_3$ as a target. The characteristics of the photoelectric conversion device thus obtained were measured by the measuring apparatus shown in FIG. 4. Measured results are similar to those for sample 1 as shown in FIGS. 2, 5 and 6.

(6) Sample 6

A mixture of PbO and $Cr_2O_3$ of a composition corresponding to the composition of $Pb_2CrO_5$ containing 20 mol % $TiO_2$ (an oxide of a tetravalent metal) was subjected to the same processes as those for Sample 1 to obtain a sintered $Pb_2CrO_5$ containing 20 mol % $TiO_2$. A photoelectric conversion device as shown in FIG. 1 was obtained by the same processes and under the same conditions as those for Sample 1 by using the sintered $Pb_2CrO_5$ containing 20 mol % $TiO_2$ as a target. The characteristics of the photoelectric conversion device thus obtained were measured by the measuring apparatus shown in FIG. 4. Measured results are similar to those for sample 1 as shown in FIGS. 2, 5 and 6.

(7) Sample 7

A mixture of PbO and $Cr_2O_3$ of a composition corresponding to the composition of $Pb_2CrO_5$ containing 20 mol % $Nb_2O_5$ (an oxide of a pentavalent metal) was subjected to the same processes under the same conditions as those for Sample 1 to obtain a sintered $Pb_2CrO_5$ body containing 20 mol % $Nb_2O_5$. A photoelectric conversion device as shown in FIG. 1 was obtained by the same processes and under the same conditions as those for Sample 1 by using the sintered $Pb_2CrO_5$ containing 20 mol % $Nb_2O_5$ as a target. The characteristics of the photoelectric conversion device thus obtained were measured by the measuring apparatus shown in FIG. 4. Measured results are similar to those for sample 1 as shown in FIGS. 2, 5 and 6.

(8) Sample 8

A mixture of PbO and $Cr_2O_3$ of a composition corresponding to the composition of $Pb_2O_3$ of a composition corresponding to the composition of $Pb_2CrO_5$ containing 20 mol % $WO_3$ (an oxide of a hexavalent metal) was subjected to the same processes under the same conditions as those for Sample 1 to obtain a sintered $Pb_2CrO_5$ body containing 20 mol % $WO_3$. A photoelectric conversion device as shown in FIG. 1 was obtained by the same processes and under the same conditions as those for Sample 1 by using the sintered $Pb_2CrO_5$ as a target. The characteristics of the photoelectric conversion device thus obtained were measured by the measuring apparatus shown in FIG. 4. Measured results are similar to those for sample 1 as shown in FIGS. 2, 5 and 6.

(9) Sample 9

A mixture of PbO, $Cr_2O_3$ and $SrCO_3$ (a carbonate of a bivalent metal) of a composition corresponding to the composition of $(Pb_{0.7}Sr_{0.3})_2 CrO_5$ was subjected to the same processes under the same conditions as those for Sample 1 to obtain a sintered $(Pb_{0.7}Sr_{0.3})_2CrO_5$ body. A photoelectric conversion device as shown in FIG. 1 was obtained by the same processes and under the same conditions as those for Sample 1 by using the sintered $(Pb_{0.7}Sr_{0.3})_2CrO_5$ body as a target. The characteristics of the photoelectric conversion device thus obtained were measured by the measuring apparatus shown in FIG. 4. Measured results are similar to those for sample 1 as shown in FIGS. 2, 5 and 6.

(10) Sample 10

A mixture of PbO, $Cr_2O_3$ and $WO_3$ (an oxide of a hexavalent metal) was subjected to the same processes under the same conditions as those for Sample 1 to obtain a sintered $Pb_2(Cr_{0.5}W_{0.5})O_5$ body. A photoelectric conversion device as shown in FIG. 1 was obtained by the same process and under the same conditions as those for Sample 1 by using the sintered $Pb_2(Cr_{0.5}W_{0.5})O_5$ as a target. The characteristics of the photoelectric conversion device thus obtained were measured by the measuring apparatus shown in FIG. 4. Measured results are similar to those for sample 1 as shown in FIGS. 2, 5 and 6.

(11) Sample 11

A mixture of PbO, $Cr_2O_3$, $SrCO_3$ (a carbonate of a bivalent metal) and $WO_3$ (an oxide of a hexavalent metal) of a composition corresponding to the composition of $(Pb_{0.7}Sr_{0.3})_5(Cr_{0.7}W_{0.3})O_8$ was subjected to the same processes under the same conditions as those for Sample 1 to obtain a sintered $(Pb_{0.7}Sr_{0.3})_5(Cr_{0.7}W_{0.3})O_8$ body. A photoelectric conversion device as shown in FIG. 1 was obtained by the same processes and under the same conditions as those for Sample 1 by using the sintered $(Pb_{0.7}Sr_{0.3})_5(Cr_{0.7}W_{0.3})O_8$ as a target. The characteristics of the photoelectric conversion device were measured by the measuring apparatus shown in FIG. 4. Measured results are similar to those for sample 1 as shown in FIGS. 2, 5 and 6.

(12) Sample 12

A mixture of PbO, $Cr_2O_3$, $SrCO_3$ (a carbonate of a bivalent metal) and $WO_3$ (an oxide of a hexavalent metal) of a composition corresponding to the composition of $(Pb_{0.7}Sr_{0.3})(Cr_{0.7}W_{0.3})O_4$ was subjected to the same processes under the same conditions as those for Sample 1 to obtain a sintered $(Pb_{0.7}Sr_{0.3})(Cr_{0.7}W_{0.3})O_4$ body. A photoelectric conversion device as shown in FIG. 1 was obtained by the same processes and under the same conditions as those for Sample 1 by using the sintered $(Pb_{0.7}Sr_{0.3})(Cr_{0.7}W_{0.3})O_4$ body as a target. The characteristics of the photoelectric conversion device thus obtained were measured by the measuring apparatus shown in FIG. 4. Measured results are similar to those for sample 1 as shown in FIGS. 2, 5 and 6.

(13) Sample 13

A mixture of PbO, $Cr_2O_3$, $SrCO_3$ (a carbonate of a bivalent metal) and $WO_3$ (an oxide of a hexavalent metal) of a composition corresponding to the composition of $(Pb_{0.7}Sr_{0.3})_2(Cr_{0.7}W_{0.3})O_5$ was subjected to the same processes under the same conditions as those for Sample 1 to obtain a sintered $(Pb_{0.7}Sr_{0.3})_2(Cr_{0.7}W_{0.3})O_5$ body. A photoelectric conversion device as shown in FIG. 1 was obtained by the same processes and under the same conditions as those for Sample 1 by using the $(Pb_{0.7}Sr_{0.3})_2(Cr_{0.7}W_{0.3})O_5$ body as a target. The characteristics of the photoelectric conversion device were measured by the measuring apparatus shown in FIG. 4. Measured results are similar to those for sample 1 as shown in FIGS. 2, 5 and 6.

[B] Second Embodiment

The respective coated glass substrates of Samples 1 to 13 were subjected to heat treatment under different temperature conditions, and then a pair of conductive films were formed on each coated and heat-treated glass substrate by the same process and under the same conditions to form photoelectric conversion devices.

The photosensitivities of the photoelectric conversion devices were measured. It was found that a temperature of heat treatment below 150° C. is unable to provide the photoelectric conversion device with any photosensitivity and hence the temperature of the heat treatment must be a temperature above 150° C.

[C] Third Embodiment (1) Sample 1

A sintered $Pb_5CrO_8$ body and a sintered $PbCrO_4$ body were obtained from a mixture similar to that of Sample 1 of the first embodiment [A]. Then, two kinds of photoelectric conversion devices were manufactured by coating glass substrates with a thin $Pb_5CrO_8$ film and a thin $PbCrO_4$ film by using the sintered $Pb_5CrO_8$ and $PbCrO_4$ bodies as targets, subjecting the coated glass substrates to heat treatment, and forming conductive films on the coated and heat-treated glass substrates, respectively. Both photoelectric conversion devices were photosensitive.

(2) Sample 2

A sintered $Pb_2CrO_8$ body and a sintered $PbCrO_4$ body were obtained from a mixture similar to that of Sample 1 of the first embodiment [A]. Photoelectric conversion devices were manufactured by the same processes as those for Sample 1 of the third embodiment [C]. The photoelectric conversion devices were photosensitive similarly to Sample 1 of the third embodiment [C]. It was confirmed also that other Perovskite oxides having the same composition as that of $PbZrO_3$ or $Pb(Co_{0.5}Nb_{0.5})O_3$ provide the same result as those provided by $PbTiO_2$.

(3) Sample 3

A sintered $Pb_5CrO_8$ body and a sintered $PbCrO_4$ body were obtained from a mixture similar to that of Sample 1 of the first embodiment [A]. Then, photoelectric conversion devices were manufactured by the same processes as those for Sample 1 of the third embodiment [C]. It was confirmed that both photoelectric conversion devices are photosensitive as those of Sample 1 of the third embodiment [C]. Addition of at least one of the carbonates of univalent metals, such as Li, Na, Rb, Cs and Cu, provides the same result as that obtained by the addition of $K_2CO_3$.

(4) Sample 4

A sintered $Pb_5CrO_8$ body and a sintered $PbCrO_4$ body were obtained from a mixture similar to that of Sample 1 of the first embodiment [A]. Then, photoelectric conversion devices were manufactured by the same processes as those for Sample 1 of the third embodiment [C]. It was confirmed that both photoelectric conversion devices are photosensitive. It was confirmed also that the addition of at least one of the carbonates of bivalent metals, such as Zn, Sr and Ca, provides the same results as that provided by the addition of $BaCO_3$.

(5) Sample 5

A sintered $Pb_5CrO_8$ body and a sintered $PbCrO_4$ body were obtained from a mixture similar to that for Sample 5 of the first embodiment [A]. Then, photoelectric conversion devices were manufactured by the same processes as those for Sample 1 of the third embodiment [C]. It was confirmed that both photoelectric conversion devices are photosensitive as Sample 1 of the third embodiment [C]. It was confirmed also that In, namely, another trivalent metal, may be used, and that the addition of $In_2O_3$ provides the same result provided by the addition of $Al_2O_3$.

(6) Sample 6

A sintered $Pb_5CrO_8$ body and a sintered $PbCrO_4$ body were obtained from a mixture similar to that for Sample 6 of the first embodiment [A]. Then, photoelectric conversion devices were manufactured by the same processes as those for Sample 1 of the third embodiment [C]. Both photoelectric conversion devices were photosensitive. It was confirmed that the addition of an oxide of a tetravalent metal, such as Si or Zr, provides the same result as that provided by the addition of $TiO_2$.

(7) Sample 7

A sintered $Pb_5CrO_8$ body and a sintered $PbCrO_4$ body were obtained from a mixture similar to that for Sample 7 of the first embodiment [A]. Then, photoelectric conversion devices were manufactured by the same processes as those for Sample 1 of the third embodiment [C]. It was confirmed that both photoelectric conversion devices are photosensitive. It was confirmed also that the addition of an oxide of a pentavalent metal, such as Ta or V, provides the same result as that provided by the addition of $Nb_2O_5$.

(8) Sample 8

A sintered $Pb_5CrO_8$ body and a sintered $PbCrO_4$ body were obtained from the same mixture as that for Sample 1 of the first embodiment [A]. Then, photoelectric conversion devices were manufactured by the same processes as those for Sample 1 of the third embodiment [C]. It was found that both photoelectric conversion devices are photosensitive. It was confirmed also that the addition of an oxide of other hexavalent metals, such as Mn or Mo, provides the same result as that provided by the addition of $WO_3$.

(9) Sample 9

A sintered $(Pb_{0.7}Sr_{0.3})_5CrO_8$ body and a sintered $(PB_{0.7}Sr_{0.3})CrO_4$ body were obtained from a mixture similar to that for Sample 9 of the first embodiment [A]. Then, photoelectric conversion devices were manufactured by the same processes as those for Sample 1 of the third embodiment [C]. Both photoelectric conversion devices were photosensitive. It was confirmed also that the use of $BaCO_3$ or $CaCO_3$ instead of $SrCO_3$ provides the same result as that provided by the use of $SrCO_3$.

(10) Sample 10

A sintered $Pb_5(Cr_{0.5}W_{0.5})O_8$ body and a sintered $Pb(Cr_{0.5}W_{0.5})O_4$ body were obtained from a mixture similar to that for Example 10 of the first embodiment [A]. Then, photoelectric conversion devices were manufactured by the same processes as those for Example 1 of the third embodiment [C]. Both photoelectric conversion devices were photosensitive. It was confirmed also that the addition of $MnO_3$ or $MoO_3$ instead of $WO_3$ provides the same result as that provided by the addition of WO.

(11) Sample 11

Carbonates of bivalent metals, namely, $BaCO_3$ and $CaCO_3$ were added in addition to $WO_3$ to the mixture for Sample 11 of the first embodiment [A], and then the mixture was processed to obtain a sintered $(Pb_{0.7}Ba_{0.3})_5(Cr_{0.7}W_{0.3})O_8$ body and a sintered $(Pb_{0.7}Ca_{0.3})_5(Cr_{0.7}W_{0.3})O_8$ body. Then, photoelectric conversion devices were manufactured by the same processes as those for Sample 1 of the third embodiment [C]. Both photoelectric conversion devices were photosensitive. The addition of $MnO_3$ or $MoO_3$ instead of $WO_3$ provided the same result as that provided by the addition of $WO_3$.

(12) Sample 12

Carbonates of bivalent metals, namely, $BaCO_3$ and $CaCO_3$ were added in addition to $WO_3$ to the mixture for Sample 12 of the first embodiment [A], and then the mixture was processed to obtain a sintered $(Pb_{0.7}Ba_{0.3})(Cr_{0.7}W_{0.3})O_4$ body and a sintered $(Pb_{0.7}Ca_{0.3})(Cr_{0.7}W_{0.3})O_4$ body. Oxides of Mn and Mo, namely, $MnO_3$ or $MoO_3$ were added instead of $WO_3$ to the mixture for Sample 12 of the first embodiment [A], and then the mixture was processed to obtain a sintered body. The same result as that provided by $WO_3$ was provided.

(13) Sample 13

Sintered $(Pb_{0.7}Ba_{0.3})_2(Cr_{0.7}W_{0.3})O_5$ body and a sintered $(Pb_{0.6}Ca_{0.3})_2(Cr_{0.7}W_{0.3})O_5$ body were obtained from the mixture for Sample 13 of the first embodiment [A] containing $BaCO_3$ and $CaCO_3$ in addition, to $WO_3$.

Addition of $MnO_3$ or $MoO_3$ instead of $WO_3$ provided the same result as that provided by the addition of $WO_3$.

[D] Fourth Embodiment

(1) Sample 1 similarly to the mixture for Sample 1 of the first embodiment [A], mixtures for Sample 1 of the fourth embodiment were prepared by mixing PbO and $Cr_2O_3$. Mixtures of various PbO-to-$Cr_2O_3$ ratios were prepared to obtain sintered lead chromate bodies of various compositions. The sintered lead chromate bodies of various compositions were used as targets in forming thin lead chromate films of various compositions on substrates, respectively. The substrates carrying the thin lead chromate films, respectively, were subjected to heat treatment, and then conductive films were formed on the lead chromate films to obtain a plurality of kinds of photoelectric conversion devices. The photovoltaic characteristics of these photoelectric conversion devices were measured. The measured results showed that the thin films having PbO content of 99.5 mol % or above and those having $Cr_2O_3$ content of 70 mol % or above are scarcely capable of photovoltage generation. When the content of $Cr_2O_3$ was excessively greater than that of PbO, mixed crystals of $PbCrO_4$ and $Cr_2O_3$ were formed. Similarly, when the content of PbO was excessively greater than that of $Cr_2O_3$, mixed crystals of $Pb_5CrO_8$ and PbO were formed. When the PbO-to-$Cr_2O_3$ ratio was in the intermediate range, mixed crystals of PbO, $Cr_2O_3$, $Pb_2CrO_5$, $Pb_5CrO_8$ and/or $PbCrO_4$ were formed.

It was also found that the thin films consisting substantially of a single oxide among $Pb_2CrO_5$, $Pb_5CrO_8$ and $PbCrO_4$ have excellent photovoltaic characteristics.

(2) Sample 2

The same base materials as those for Sample 2 of the first embodiment [A] were mixed in various content ratios to obtain sintered chromate bodies of different compositions. Photoelectric conversion devices were formed by the same processes as those for Sample 1 of the fourth embodiment [D]. The photovoltaic characteristics of the photoelectric conversion devices were the same as those of Sample 1 of the fourth embodiment [D]. The thin films having $PbTiO_3$ content of 95 mol % or above were scarcely capable of photovoltage generation. Furthermore, when the content ratio of the mixture of the materials was in the intermediate range covered by the content ratio of the mixture for Sample 1, mixed crystals including $PbTiO_3$ were formed. The photoelectric conversion devices have excellent photovoltaic characteristics as those of Sample 1 of the fourth embodiment [D].

(3) Sample 3

Sintered chromate bodies of different content ratios were formed from mixtures containing the same base materials as those for Sample 3 of the first embodiment [A] in different content ratios. Photoelectric conversion devices were formed by the same processes as those for Sample 1 of the fourth embodiment [D]. The photoelectric conversion devices thus formed had the same photovoltaic characteristics as those of the photoelectric conversion devices of Sample 1 of the fourth embodiment [D]. The thin films having $K_2CO_3$ content of 80 mol % or above were scarcely capable of photovoltage generation. Furthermore, when the content ratio of the mixtures was in the intermediate range covered by the content ratio of the mixture for Sample 1, mixed crystals including $K_2O$ were formed. The photoelectric conversion devices had excellent photovoltaic characteristics as those of Sample 1 of the fourth embodiment [D].

(4) Sample 4

Sintered chromate bodies of different content ratios were formed from mixtures containing the same base materials as those for Sample 4 of the first embodiment [A] in different content ratios. Photoelectric conversion devices were formed by the same processes as those for Sample 1 of the fourth embodiment [D]. The photoelectric conversion devices had the same photovoltaic characteristics as those of Sample 1 of the fourth embodiment [D]. The thin films having $BaCO_3$ content of 55 mol % or above were scarcely capable of photovoltage generation. Furthermore, when the content ratio of the mixtures was in the intermediate range covered by the content ratio of the mixture for Sample 1, mixed crystals including BaO were formed. The photoelectric conversion devices had excellent photovoltaic characteristics as those of Sample 1 of the fourth embodiment [D].

(5) Sample 5

Sintered chromate bodies of different content ratios were formed from mixtures containing the same base materials as those for Sample 5 of the first embodiment [A] in different content ratios. Photoelectric conversion devices were formed by the same processes as those for Sample 1 of the fourth embodiment [D]. The photoelectric conversion devices had the same photovoltaic characteristics as those of Sample 1 of the fourth embodiment [D]. The thin films having $Al_2O_3$ content of 55 mol % or above were scarcely capable of photovoltage generation. Furthermore, when the content ratio of the mixtures was in the intermediate range covered by the content ratio of the mixture for Sample 1, mixed crystals including $Al_2O_3$ were formed. The photoelectric conversion devices had excellent photovoltaic characteristics as those of Sample 1 of the fourth embodiment [D].

(6) Sample 6

Sintered chromate bodies of different content ratios were formed from mixtures containing the same base materials as those for Sample 6 of the first embodiment [A] in different content ratios. Photoelectric conversion devices were formed by the same processes as those for Sample 1 of the fourth embodiment [D]. The photoelectric conversion devices had the same photovoltaic characteristics as those of Sample 1 of the fourth embodiment [D]. The thin films having $TiO_2$ content of 55 mol % or above were scarcely capable of photovoltage generation. Furthermore, when the content ratio of the mixtures was in the intermediate range covered by the content ratio of the mixture of Sample 1, mixed crystals including $TiO_2$ were formed. The photoelectric conversion devices had excellent photovoltaic characteristics as those of Sample 1 of the fourth embodiment [D].

(7) Sample 7

Sintered chromate bodies of different content ratios were formed from mixtures containing the same base materials as those for Sample 7 of the first embodiment [A] in different content ratios. Photoelectric conversion devices were formed by the same processes as those for Sample 1 of the fourth embodiment [D]. The photoelectric conversion devices had the same photovoltaic characteristics as those of Sample 1 of the fourth embodiment [D]. The thin films having $Nb_2O_5$ content of 55 mol % or above were scarcely capable of photovoltage generation. Furthermore, when the content ratio of the mixtures was in the intermediate range covered by the content ratio of the mixture for Sample 1, mixed crystals including $Pb_2Nb_2O_6$ and $Nb_2O_5$ were formed. The photoelectric conversion devices had excellent photovoltaic characteristics as those of Sample 1 of the fourth embodiment D.

(8) Sample 8

Sintered chromate bodies of different content ratios were formed from mixtures containing the same base materials as those for Sample 8 of the first embodiment [A] in different content ratios. Photoelectric conversion devices were formed by the same processes as those for Sample 1 of the fourth embodiment [D]. The photoelectric conversion devices had the same photovoltaic characteristics as those of Sample 1 of the fourth embodiment [D]. The thin films having $WO_3$ content of 60 mol % or above were scarcely capable of photovoltage generation. Furthermore, when the content ratio of the mixture was in the intermediate range, covered by the content ratio of the mixture for Sample 1 mixed crystals including $WO_3$ were formed. The photoelectric conversion devices had excellent photovoltaic characteristics as those of Sample 1 of the fourth embodiment [D].

(9) Sample 9

Sintered chromate bodies of different content ratios were formed from mixtures containing the same base material as those for Sample 9 of the first embodiment [A]. Photoelectric conversion devices were formed by the same processes as those for Sample 1 of the fourth embodiment [D]. The following results were obtained through the measurement of the photovoltaic characteristics of the photoelectric conversion devices.

When the content of PbO in (Pb-Sr)O was 99.5 mol % or above and when the content of $Cr_2O_3$ in the thin film was 70 mol % or above, the thin films were scarcely capable of photovoltage generation. When the value of x in a general formula: $(Pb_{1-x}Sr_x)O$ was 0.95 (95 mol %) or above, the thin films were scarcely capable of photovoltaic power generation.

When the content of $Cr_2O_3$ was excessively greater than that of $(Pb-Sr)CrO_4$ in the thin film, mixed crystals of $(Pb-Sr)CrO_4$ and $Cr_2O_3$ were formed. Similarly, when the content of PbO was excessively greater than that of $(PbSr)_5CrO_8$, mixed crystals of $(Pb-Sr)_5CrO_8$ and PbO were formed. In the intermediate range of the content ratio, mixed crystals of PbO, $Cr_2O_3$, $SrCO_3$, $Pb_2CrO_5$, $Pb_5CrO_8$ and/or $PbCrO_4$ were formed.

Furthermore, the thin films substantially of one of $(Pb-Sr)_2CrO_5$, $(Pb-Sr)_5CrO_8$ and $(Pb-Sr)CrO_4$ had excellent photovoltaic characteristics.

Several photoelectric conversion devices other than those of the foregoing examples were formed by using thin films respectively having different substitution ratios x other than those for the foregoing thin films. These photoelectric conversion devices also had excellent photovoltaic characteristics provided that the value of x is in the range of 0 to 0.95 (95 mol %). When the content ratio Z of lead oxide in the thin films comprising lead oxide and chromium oxide were outside the range of 0.3 (30 mol %) to 0.995 (99.5 mol %), the photoelectric conversion devices provided with such thin films, respectively, were incapable of photovoltaic power generation.

(10) Sample 10

Sintered chromate bodies of different content ratios were formed from mixtures containing the same base materials as those for Sample 10 of the first embodiment [A]. Photoelectric conversion devices were formed by the same processes as those for Sample 1 of the fourth embodiment [D]. The following results were obtained through the measurement of the photovoltaic characteristics of the photoelectric conversion devices.

When the content of $Cr_2O_3$ in $(Cr-W)_2O_3$ was 70 mol % or above and when the content of PbO in the thin film was 99.5 mol % or above, the photoelectric conversion devices provided with such thin films were scarcely capable of photovoltaic power generation. When the value of y in the general formula: $(Cr_{1-y}W_y)O$ was 0.95 (95 mol %) or above, the photoelectric conversion devices provided with such thin films were scarcely capable of photovoltage generation.

When the content of $Cr_2O_3$ was excessively greater than that of $Pb(Cr-W)O_4$ in a film of PbO and $(Cr-W)_2O_3$, mixed crystals of $Pb(Cr-W)O_4$ and $Cr_2O_3$ were formed. Similarly, when the content of PbO was excessively greater than that of $Pb_5(Cr-W)O_8$, mixed crystals of $Pb_5(Cr-W)O_8$ and PbO were formed. In the intermediate range of content ratio, mixed crystals of PbO, $Cr_2O_3$, $WO_3$, $Pb_2CrO_5$, $Pb_5CrO_8$ and/or $PbCrO_4$ were formed.

Furthermore, the thin films substantially of one of $Pb_2(Cr-W)O_5$, $Pb_5(Cr-W)O_8$ and $Pb(Cr-W)O_4$ had excellent photovoltaic characteristics. The variation of the substitution ratio of the metal brought about the same effects as in Sample 9 of the fourth embodiment [D].

(11) Sample 11

Sintered chromate bodies of different content ratios were formed from mixtures containing the same base materials as those for Sample 11 of the first embodiment [A]. Photoelectric conversion devices were formed by the same processes as those for Sample 1 of the fourth embodiment [D]. The following results were obtained through the measurement of the photovoltaic characteristics of the photoelectric conversion devices. When the values of x and y in a general formula: $(Pb_{1-x}Sr_x)_5(Cr_{1-y}W_y)O_8$ were 0.95 (95 mol %) or above, the photoelectric conversion devices were scarcely capable of photovoltage generation.

Several photoelectric conversion devices other than those of the foregoing examples were formed by using thin films respectively having different substitution ratios x and y for two kinds of substitution metals, respectively, other than those for the foregoing thin films. These photoelectric conversion devices also had excellent photovoltaic characteristics provided that the values of x and y were in the range of 0 to 0.95 (95 mol %).

(12) Sample 12

Sintered chromate bodies of different content ratios were formed from mixtures containing the same base materials as those for Sample 12 of the first embodiment [A]. Photoelectric conversion devices were formed by the same processes as those for Sample 1 of the fourth embodiment [D]. The following results were obtained through the measurement of the photovoltaic characteristics of the photoelectric conversion devices. When the values of x and y in a general formula: $(Pb_{1-x}Sr_x)(Cr_{1-y}W_y)O_4$ were 0.95 (95 mol %) or above, the photoelectric conversion devices were scarcely capable of photovoltage generation.

The variation of the substitution ratios x and y of two kinds of the metals brought about the same effects as in Sample 11 of the fourth embodiment [D].

(13) Sample 13

Sintered chromate bodies of different content ratios were formed from mixtures containing the same base materials as those for Sample 13 of the first embodiment [A] in different content ratios. Photoelectric conversion devices were formed by the same processes as those for Sample 1 of the fourth embodiment [D]. The following results were obtained through the measurement of the photovoltaic characteristics of the photoelectric conversion devices. When the values of x and y in a general formula: $(Pb_{1-x})_2(Cr_{1-y}W_y)O_5$ were 0.95 (95 mol %) or above, the photoelectric conversion devices were scarcely capable of photovoltage generation. The variation of the substitution ratios x and y of two kinds of the metals brought about the same effects as in Sample 11 of the fourth embodiment [D].

Although the present invention has been described as employing the electron beam evaporation process as means for forming the thin Pb—Cr oxide films, as thin films of $Pb_2CrO_5$, for the foregoing embodiments, means for forming such thin films is not limited thereto, but other means for forming thin films in a vacuum, as such a sputtering process, or an ion beam evaporation process, may be employed as means for forming such thin films. Furthermore, the conductive films may be of aluminum or copper instead of gold films.

The substrate need not necessarily be a glass substrate, but a substrate of any other suitable material may be used. A photoelectric conversion device having an optional thickness and a uniform thin film having few pores can be formed by employing a substrate coated with the thin film.

As apparent from the foregoing description, according to the present invention, a Pb—Cr oxide film is formed in a vacuum and the Pb—Cr oxide film is heat-treated, and hence the present invention is capable of the following effects.

(1) The light-transmissive thin film enhances the photoelectric conversion efficiency of the photoelectric conversion device.

(2) The uniform thin film having few pores provides a photoelectric conversion device of high quality and high reliability.

(3) The application of vacuum techniques to forming the thin film enables the mass production of photoelectric conversion devices, whereby photoelectric conversion devices can be manufactured at a low cost.

Although the invention has been described in its preferred form with a certain degree of particularity, it is to be understood that many variations and changes may be made in the invention without departing from the spirit and scope thereof.

What is claimed is:

1. A method of manufacturing a photoelectric conversion device, comprising: forming a thin film of a substance containing PbO and $Cr_2O_3$ in a vacuum by using the substance as a target; and subjecting the thin film to heat treatment in an atmosphere containing at least Pb.

2. A method of manufacturing a photoelectric conversion device, as recited in claim 1, wherein the substance used as a target is a substance expressed by a formula: $(Pb_{1-x}A_x)_2(Cr_{1-y}B_y)O_5$, where $0<x<0.95$, $0<y<0.95$, A is at least one of Sr, Ba and Ca, and B is at least one of W, Mn and Mo.

3. A method of manufacturing a photoelectric conversion device, as recited in claim 1, wherein the substance used as a target contains a material containing 30 to 99.5 mol % PbO and 0.5 to 70 mol % $Cr_2O_3$, and a maximum of 95 mol % perovskite oxide.

4. A method of manufacturing a photoelectric conversion device, as recited in claim 1, wherein the substance used as a target contains a material containing 30 to 99.5 mol % PbO and 0.5 to 70 mol % $Cr_2O_3$, and a maximum of 80 mol % carbonate of a univalent metal.

5. A method of manufacturing a photoelectric conversion device, as recited in claim 1, wherein the substance used as a target contains a material containing 30 to 99.5 mol % PbO and 0.5 to 70 mol % $Cr_2O_3$, and a maximum of 55 mol % carbonate of bivalent metal.

6. A method of manufacturing a photoelectric conversion device, as recited in claim 1, wherein the substance used as a target contains a material containing 30 to 99.5 mol % PbO and 0.5 to 70 mol % $Cr_2O_3$, and a maximum of 55 mol % $M_2O_3$, where M is a trivalent metal.

7. A method of manufacturing a photoelectric conversion device, as recited in claim 1, wherein the substance used as a target contains a material containing 30 to 99.5 mol % PbO and 0.5 to 70 mol % $Cr_2O_3$, and a maximum of 55 mol % of $MO_2$, where M is a tetravalent metal.

8. A method of manufacturing a photoelectric conversion device, as recited in claim 1, wherein the substance used as a target contains a material containing 30 to 99.5 mol % PbO and 0.5 to 70 mol % $Cr_2O_3$, and a maximum of 55 mol % of $M_2O_5$, where M is a pentavalent metal.

9. A method of manufacturing a photoelectric conversion device, as recited in claim 1, wherein the substance used as a target contains a material containing 30 to 99.5 mol % PbO and 0.5 to 70 mol % $Cr_2O_3$, and a maximum of 60 mol % of $MO_3$, where M is a hexavalent metal.

10. A method of manufacturing a photoelectric conversion device, as recited in claim 1, wherein the substance used as a target is a substance expressed by a formula: $Z(Pb_{1-x}A_x)O(1-Z)Cr_2O_3$, where $0.3<Z<0.995$, $0<x<0.95$ and A is at least one of Sr, Ba and Ca.

11. A method of manufacturing a photoelectric conversion device, as recited in claim 1, wherein the substance used as a target is a substance expressed by a formula: $ZPbO(1-Z)(Cr_{1-y}B_y)O$, where $0.3<Z<0.995$, $0<y<0.95$ and B is at least one of W, Mn and Mo.

12. A method of manufacturing a photoelectric conversion device, as recited in claim 1, wherein the substance used as a target is a substance expressed by a formula: $(Pb_{1-x}A_x)_5(Cr_{1-y}B_y)O_8$, where $0<x<0.95$, $0<y<0.95$, A is at least one of Sr, Ba and Ca, and B is at least one of W, Mn and Mo.

13. A method of manufacturing a photoelectric conversion device, as recited in claim 1, wherein the substance used as a target is a substance expressed by a formula: $(Pb_{1-x}A_x)(Cr_{1-y}B_y)O_4$, where $0<x<0.95$, $0<y<0.95$, A is at least one of Sr, Ba and Ca, and B is at least one of W, Mn and Mo.

* * * * *